United States Patent
Carbajal Ipenza (10) Patent No.: US 11,075,617 B1
(45) Date of Patent: Jul. 27, 2021

(54) DC-REMOVING CIC FILTER

(71) Applicant: NXP USA, Inc., Austin, TX (US)

(72) Inventor: Sammy Johnatan Carbajal Ipenza, Campinas (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/856,961

(22) Filed: Apr. 23, 2020

(51) Int. Cl.
H03H 17/06 (2006.01)

(52) U.S. Cl.
CPC .... H03H 17/0671 (2013.01); H03H 17/0664 (2013.01)

(58) Field of Classification Search
CPC ................................................. H03H 17/0671
See application file for complete search history.

(56) References Cited

U.S. PATENT DOCUMENTS

| | | | | |
|---|---|---|---|---|
| 7,324,025 | B1* | 1/2008 | Ding | H03H 17/0671 341/118 |
| 7,583,765 | B2 | 9/2009 | Beamish | |
| 8,873,687 | B2 | 10/2014 | Kim et al. | |
| 9,608,598 | B1 | 3/2017 | Melanson | |
| 2003/0069911 | A1* | 4/2003 | Piirainen | H03H 17/0671 708/313 |
| 2014/0242936 | A1 | 8/2014 | Seely | |
| 2015/0236670 | A1 | 8/2015 | Pande et al. | |
| 2018/0159510 | A1* | 6/2018 | Lamb | H03H 17/0664 |
| 2018/0367123 | A1 | 12/2018 | Gudivskiy et al. | |
| 2019/0036557 | A1 | 1/2019 | Ipenza | |
| 2019/0379358 | A1 | 12/2019 | Bal et al. | |

FOREIGN PATENT DOCUMENTS

| | | |
|---|---|---|
| CN | 102025377 A | 4/2011 |
| CN | 104539252 A | 4/2015 |

OTHER PUBLICATIONS

Ljiljana Milic, Multirate Filtering for Digital Signal Processing: MATLAB Applications, IGI Global, 2009, Chapter 11 Comb-based filter for sampling conversion (pp. 316-346).
Richard G. Lyons, Understanding Digital Signal Processing, Prentice Hall PTR Upper Saddle River, NJ, 2004, Section 10.5 Cascaded Integrator-Comb Filters (pp. 397-409), and Section 13.23 DC Removal (pp. 552-556).
Eugene B. Hogenauer, An Economical Class of Digital Filters for Decimation and Interpolation, IEEE Transactions on Acoustics, Speech, and Signal Processing, vol. Assp-29, No. 2, Apr. 1981.
Fred Harris et al., FPGA Signal Processing Using Sigma-Delta Modulation, IEEE Special Issue Magazine on Industrial Signal Processing, Aug. 1999.

* cited by examiner

Primary Examiner — Chuong D Ngo (57) ABSTRACT

A DC-removing cascaded integrator-comb (CIC) filter circuit (40) includes N series-coupled integrator stages (401-405), a rate changer (406), and N series-coupled comb stages (407-411) which are configured to receive a CIC filter digital input signal and to generate a CIC filter digital output signal, wherein the N integrator stages include a first integrator stage (401) which includes a summation element (41) having first input for receiving a first input signal, a second input for receiving a second input signal, and an output coupled through a feedback delay element (42) to a multiplier element (43) which multiplies a DC-removing filter coefficient with an output of the feedback delay element to generate a product output that is provided to the second input of the summation element (41), thereby embedding a DC-removing filter in the N series-coupled integrator stages.

20 Claims, 4 Drawing Sheets

United States Patent US 11,075,617 B1

DC-REMOVING CIC FILTER

BACKGROUND OF THE INVENTION

Field of the Invention

The present invention is directed in general to digital circuits. In one aspect, the present invention relates to cascaded integrator-comb (CIC) filters and methods for manufacturing and/or operating same.

Description of the Related Art

In digital signal processing applications, signals may be processed with cascaded integrator-comb (CIC) filters which are an optimized class of finite impulse response (FIR) filters that incorporate an interpolator or decimator into the architecture. Conventional CIC filters include one or more integrator and comb filter pairs, and may be used to increase (upsample) or decrease (downsample) a sample rate for a digital signal. For example, a CIC filter may be used to upsample a digital input signal that is produced by, for example, a digital signal processor (DSP) for conversion by a digital-to-analog converter (DAC) to an analog signal. Conversely, a CIC filter may be used to downsample a digital input signal that is produced by, for example, an analog-to-digital converter (ADC) for processing by a DSP at a lower sampling rate. In some cases, the input and outputs to the CIC filter may require different sample rates or frequencies, so the CIC filter may be used in multi-rate processing applications to effectuate the sample rate change for the signal. While CIC filters are in general much more economical than general FIR filters, there are performance and design tradeoffs involved. For example, FIR filters generally have the advantage in cases where only a small amount of interpolation or decimation are needed. But when rates change by a factor of 10 or more, CIC filters have a significant advantage over a FIR filter with respect to architectural and computational efficiency. On the other hand, the range of filter shapes and responses available from CIC filters is somewhat limited in meeting the requirements of modern digital communication systems. For example, there can be non-zero DC bias levels in audio signals that arise when concatenating two audio signals or switching between two audio signals, resulting in unpleasant audible clicks, degrading system performance, and increasing bit error rates. To remove or reduce DC bias, DC-removal filters are often used in multi-rate systems, such as by connecting an external DC-removal filter either before or after a CIC filter.

Figure 1:
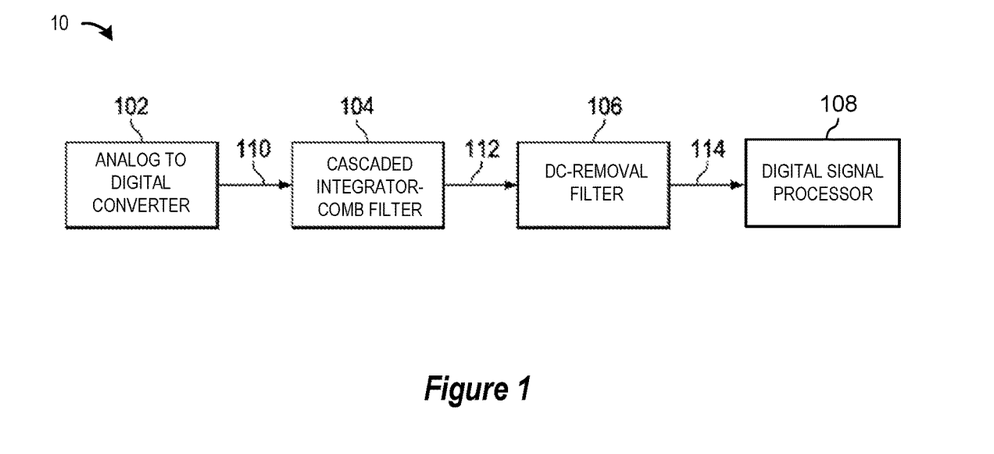
FIG. 1 depicts a block diagram of a digital signal processing system which includes a CIC filter and external DC-removal filter.

For example, FIG. 1 illustrates a conventional digital signal processor system 10 that includes an analog-to-digital converter (ADC) 102, cascaded integrator-comb (CIC) filter 104, DC-removal filter 106, and digital signal processor (DSP) 108 which are all coupled to one another. The ADC 102 receives an analog input signal (e.g., from a microphone) and generates a digital output signal 110 using any suitable electronic ADC, such as a direct conversion ADC, successive approximation ADC, an oversampling delta-sigma ADC, or the like. The CIC filter 104 receives the input signal 110 from ADC 102 or from any suitable device capable of providing a digital signal, and is configured to convert the sampled digital input signal 110 to a higher sampling rate (i.e., upsampling) or to a lower sampling rate (i.e., downsampling) and produce output signal 112 at either a higher or lower sample rate than the sample rate of the input signal 110. For example, when CIC filter 104 is configured for interpolation, CIC filter 104 receives the input signal 110 at a first sample rate and produces an output signal 112 at a second, higher, sample rate based on an interpolation rate (i.e., the amount of interpolation rate change or the upsampling rate) built into CIC filter 104. The DC-removal filter 106 receives the input signal 112 from CIC filter 104, and may be configured as a high-pass IIR filter to remove DC bias from the input signal and produce output signal 114. The DSP 108 may be implemented as a processing device that is optimized for digital signal processing, such as a microprocessor, processing core(s), application-specific integrated circuits (ASICs), field-programmable gate arrays (FPGAs), digital signal controllers, stream processors, or the like. DSP 108 may digitally process the received input signal 114 that is received at an input sample rate (i.e., the number of samples of the signal carried per second) having a baseband frequency that is smaller than the RF sampling frequency of the original analog input signal.

As seen from the foregoing, there are a number of tradeoffs with the design, manufacture, and use of CIC filters in digital signal processing applications by virtue of the challenges with balancing the competing performance and design tradeoffs of providing digital signal filtering.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

A DC-removing multi-stage CIC filter device and associated methods of operation and fabrication are described for implementing a DC-removal filter inside a CIC filter by using storage flops from one or more of the CIC filter's integrator stages in combination with a multiplier circuit to combine DC filter coefficients ($\alpha_i$) with corresponding delayed summation terms ($z^{-1}$). In selected embodiments, there is provided, a modified cascaded integrator-comb (CIC) filter which includes a modified integrator section, a rate changer, and a comb section. The modified integrator section may include a number of integrator stages which may be connected in series as a plurality of recursive integrator stages, and which includes at least one modified integrator stage having a summation element, a delay element, and a multiplier element which are connected and configured to effectively incorporate an embedded DC-removal filter which uses the delay element that would otherwise be duplicated in an external DC-removal filter, thereby reducing circuit complexity, gate count, and circuit area or size. The rate changer may implement an upsampler or downsampler function to change the sampling rate by R between the input sampling rate and output sampling rate. The comb section may include a number of comb stages which may be connected in series as a plurality of non-recursive comb stages. The disclosed DC-removing multi-stage CIC filter functions similarly to a CIC filter by filtering and upsampling (or downsampling) the CIC filter input signal, but also reduces or removes DC-bias contained in the CIC filter input signal without requiring complex external multiplier circuits or additional storage flops. Also, the number of modified integrator stages may be selected based on the order of the DC-removal filter design being embedded in the DC-removing multi-stage CIC filter.

Figure 2:
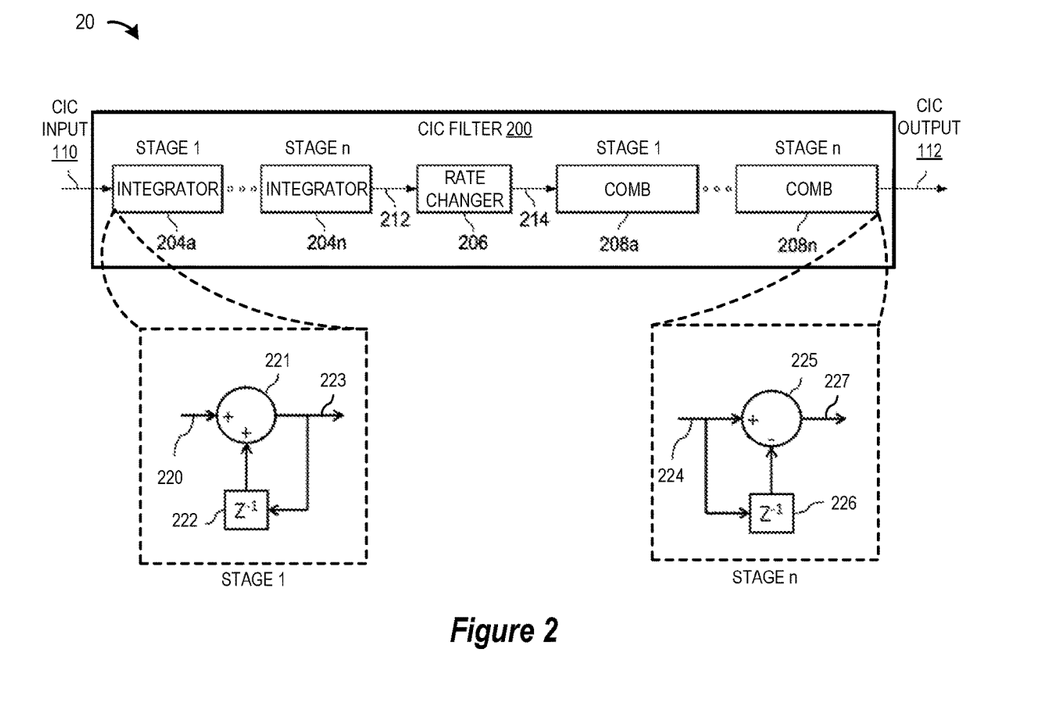
FIG. 2 depicts a simplified schematic block diagram of a multi-stage CIC decimator filter.

To provide additional details for an improved contextual understanding of the present disclosure, reference is now made to FIG. 2 which depicts a simplified schematic block diagram of a multi-stage CIC decimator filter 20. In the illustrated example, the multi-stage CIC decimator filter 200 illustrates an embodiment of the CIC filter 104 shown in FIG. 1, and may be implemented as a decimating filter that includes a plurality of integrator stages 204a, 204n, a rate changer 206 for implementing a rate change R, and a plurality of comp stages 208a, 208n. The order (n) of the CIC filter 200 identifies how many integrator stages and comb stages are provided. At the depicted CIC filter 200, the input signal 110 is received by the integrator stage(s) 204 which are connected and configured to integrate the signal to produce an output signal 212 that is a time integral of CIC input signal 110. Rate changer 206 receives the integrated input signal 212 and changes the sample rate of the signal. In selected embodiments, the rate changer 206 is an downsampler which downsamples the sample rate of the integrated input signal 212 to produce an downsample signal 214. Thus, the sample rate of downsample output signal 214 is lower than the sample rate of upsample input signal 110. Comb stage(s) 208 are connected and configured to provide a CIC output signal 112 by having each comb stage (e.g., 208n) subtract a time delayed sample value from the downsampled output signal. The output signal 112 may be provided to the DC-removal filter 106 or directly to the DSP 108.

As will be appreciated, the system function for the multi-stage CIC filter 200 referenced to the high sampling rate, $f_s$ is:

$$H(z) = \left[\sum_{k=0}^{RM-1} z^{-k}\right]^N$$

$$= \left(\frac{1-z^{-RM}}{1-z^{-1}}\right)^N$$

where R=decimation or interpolation ratio, M=number of samples per stage (usually 1 but sometimes 2), and N=number of stages in filter. In addition, it will be appreciated that the multi-stage CIC filter 200 is characterized by having a linear phase response, and being constructed with only delay flops and addition and subtraction circuits so that no multiplication circuits are used. For example, the first integrator stage 204a includes a first adder 221 and first delay block or flop 222 which are connected to integrate the input signal 220 with the output of the delay block 222 at the adder 221 to produce an output signal 223 that is a time integral of CIC input signal 220. In this example, the delay element 222 has a duration of one sample period. In addition, the last comb stage 208n includes a first subtractor or differentiator 225 and second delay block or flop 226 which are connected for subtraction of the output of the delay block 226 from the input signal 224 to produce an output signal 227 as the CIC output signal 112. As illustrated, the differentiator 225 receives the input signal on connection 224 and supplies it to the subtractor 225. The input signal on connection 224 is also supplied to the second delay block 226. In this example, the delay element 226 delays the signal on connection 224 by one sample period and supplies an output to the subtractor 225 which subtracts the delayed input signal from the input signal 224.

Figure 3:
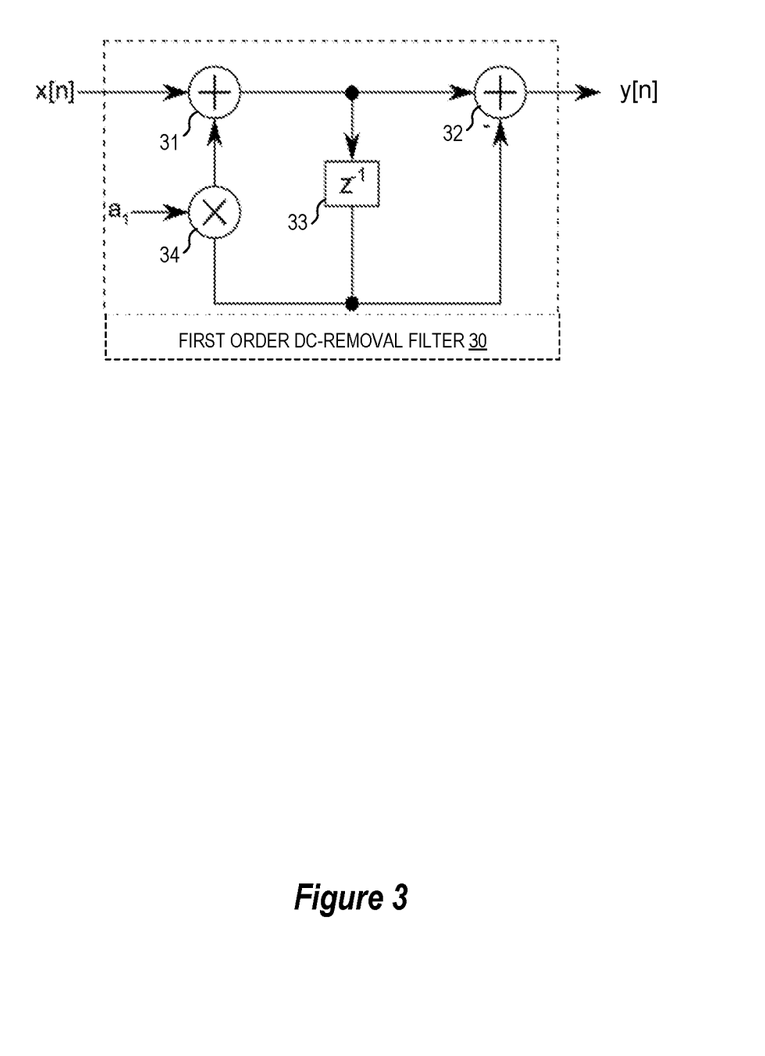
FIG. 3 depicts a simplified circuit schematic of a first order DC-removal filter.

As depicted in FIG. 1, external DC-removal or blocking filters 106 are often used in multi-rate systems to get eliminate or remove DC bias, and may be used after (or before) the CIC filter stage. The DC-removal filter may be implemented as a high-pass IIR filter having a transfer function, such as:

$$H_{dc}(z) = \frac{(1-z^{-1})^K}{(1-a_1z^{-1})(1-a_2z^{-1})\ldots(1-a_Kz^{-1})}$$

where K is the order of filter (usually 1 or 2) and $\alpha_i$ is a filter coefficient which defines the filter cut-off frequency. To provide additional details for an improved contextual understanding of the present disclosure, reference is now made to FIG. 3 which depicts a simplified circuit schematic of a first order DC-removal filter 30 (K=1). As depicted, the DC-removal filter 31 includes an adder 31, subtractor 32, a delay block or flop 33, and multiplier 34 which are connected and configured to remove or filter DC bias from the input signal x[n] when generating the output signal y[n]. In operation, the adder 31 receives the input signal x[n] and supplies an output sum signal to the subtractor 32 and delay block 33. At the delay element 33, the output sum signal from the adder 31 is delayed by one sample period and supplied to the subtractor 32 where it is subtracted from the output sum signal from the adder 31. In addition, the output from the delay element 33 is supplied to the multiplier 34 where it is multiplied with a delay coefficient $\alpha_i$ for the filter 30. The product output from the multiplier 34 is provided to the adder 31 where it is summed with the input signal x[n] when generating the output sum signal. As a result, the output signal y[n] generated by the subtractor 32 with the DC components removed or filtered. As will be appreciated, other DC-blocking filter circuits can be used, but a common circuit design requirement is that at least one delay storage element or flop and multiplier circuit is required to define the high-pass filter's cut-off frequency. For k>1 implementation, a plurality of first order filters can be staged.

As illustrated in FIG. 1, existing multi-rate systems typically include an additional or external DC-removal filter after the CIC filter stage for removing DC bias at a lower sampling rate. However, it will be appreciated that DC bias can also be removed at the CIC input sampling rate by including a DC-removal filter at the input to the CIC filter. The composite response of the combined DC-removal filter and CIC filter will be:

$$H(z) = H_{cic}(z)H_{dc}(z) = \frac{(1-z^{-RM})^N}{(1-z^{-1})^N} \frac{(1-z^{-1})^k}{(1-a_1z^{-1})(1-a_2z^{-1})\ldots(1-a_kz^{-1})}$$

which may be simplified as:

$$H(z) = H_{cic}(z)H_{dc}(z) = \frac{(1-z^{-RM})^N}{(1-z^{-1})^{N-k}(1-a_1 z^{-1})(1-a_2 z^{-1}) \ldots (1-a_k z^{-1})}$$

where:
- R=CIC decimation or interpolation ratio
- M=CIC number of samples per stage (usually 1 but sometimes 2)
- N=CIC number of stages in filter
- K=DC-removal filter order
- $\alpha_i$=filter coefficient which defines the filter cut-off frequency As this equation shows, when N≥K, one or more of the CIC integrator stages can be modified to include DC filter coefficients ($\alpha_i$) using a modified CIC filter architecture to address the design challenges and other limitations from conventional CIC filter solutions. In the foregoing equation, the numerator may be implemented with the combinator section of a modified CIC filter architecture, while the denominator may be implemented with the integrator section of the modified CIC filter architecture.

Figure 4:
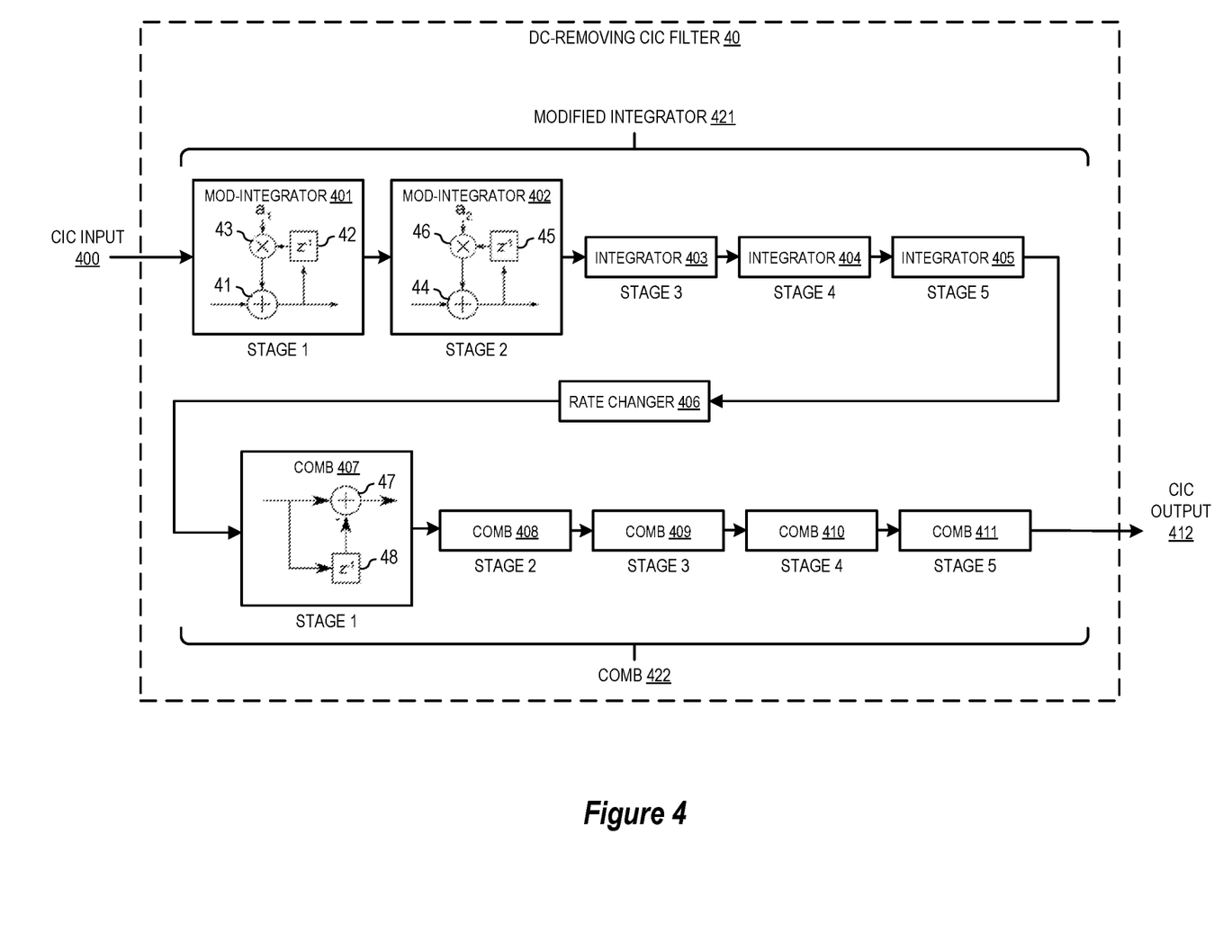
FIG. 4 depicts a simplified schematic block diagram of a DC-removing multi-stage CIC filter in accordance with selected embodiments of the present disclosure.

To provide additional details for an improved understanding of selected embodiments of the present disclosure, reference is now made to FIG. 4 which depicts a simplified schematic block diagram of a DC-removing multi-stage CIC filter 40 in accordance with selected embodiments of the present disclosure. Although a number of circuit components and blocks are illustrated in a particular arrangement in FIG. 4, the DC-removing multi-stage CIC filter 40 may include additional or fewer circuit components/blocks, and the components/blocks may have a different arrangement than that shown. In addition, the DC-removing multi-stage CIC filter 40 may be used with one channel of a digital down converter (DDC) that may have multiple channels, and that is connected to receive a high frequency digital input signal and to generate therefrom a lower frequency filtered digital output signal. Alternatively, the DC-removing multi-stage CIC filter 40 may be used with one or more channels of a digital up-converter (DUC) that is connected to receive a low frequency digital input signal and to generate therefrom a higher frequency filtered digital output signal.

In the disclosed embodiment of FIG. 4, the DC-removing multi-stage CIC filter 40 includes a modified integrator 421, rate changer 406, and combinator 422, and may be clocked with a system clock (not shown for the purposes of simplicity and clarity) to receive a CIC input signal 400 and generate an CIC output signal 412. The modified integrator 421 includes a plurality of series-connected integrator stages 401-405, including at least one modified integrator stage (represented by modified integrator stages 401, 402), alone or in combination with one or more additional integrator stages (represented by integrator stages 403-405). Each modified integrator stage (e.g., 401, 402) includes a summation element, a delay element, and a multiplier element which are connected as depicted in the figure to effectively incorporate an embedded DC-removal filter which re-uses the delay element that would otherwise be duplicated in an external DC-removal filter, thereby reducing circuit complexity, gate count, and circuit area or size. The number of modified integrator stages 401-402 may vary, depending on the order of the DC-removal filter being embedded in the modified integrator 421. In addition, the modified integrator 421 may include one more additional integrator stages (represented by integrator stages 403-405) includes a summation element and a delay element (not shown) which are connected to integrate the input signal with the output of the delay element at the summation element to produce an output signal that is a time integral of input signal.

In an example embodiment of the modified integrator 421, a first modified integrator stage 401 includes a summation element 41 having a first positive input connected to receive the CIC input signal 400, a second positive input, and an output. At the summation element 41, the first and second positive inputs are added to generate the output sum at the output. The delay element 42 has an input connected to the output from the summation element 41, and an output connected to a first input of the multiplier element 43. At the delay element 42, the output sum signal from the adder 41 is delayed by one sample period and supplied to the first input of the multiplier element 43. The multiplier element 43 has a second input connected to receive an input coefficient $\alpha_i$ and a multiplication output. At the multiplier 43, the delayed output sum signal (generated by the delay element 42) is multiplied with the input coefficient $\alpha_i$ to generate the multiplication output that is connected to a second positive input of the summation element 41. As disclosed herein, there may be additional modified integrator stages 402 connected to the first modified integrator stage 401 which are similarly constructed to include a summation element 44, a delay element 45, and a multiplier element 46 which are connected as depicted in the figure to effectively incorporate an embedded DC-removal filter which re-uses the delay storage element 45. Similar to the integrator stage 204a shown in FIG. 2, each additional integrator stage (e.g., 403) may include a summation element and a delay element which provides a delay labeled which are connected as a recursive integrator so that the summation element has a first positive input connected to receive an input from the previous stage, a second positive input connected to receive an output from the delay element, and an output that is a time integral of input signal.

At the output of the modified integrator 421, a rate changer 406 is connected to receive an input from the last integrator stage (e.g., 405). Depending upon the application of the DC-removing multi-stage CIC filter 40, the rate changer 406 generates a downsampled output signal. For example, the rate changer 406 may resample a signal received from the output of the modified integrator 421 and provide an output signal having a sample rate equal to R times the input sample rate, where R is a CIC decimation or interpolation ratio.

At the output of the rate changer 406, the combinator 422 is connected to receive the resampled output signal from the rate changer 406. In selected embodiments, the combinator 422 includes a plurality of series-connected combinator stages represented by comb stages 407-411. For example, a first comb stage 407 includes summation element 47 and delay element 48. Each delay element provides a delay labeled $z^{-1}$. In operation, the summation element 47 has a positive input connected to receive an input signal from the rate changer 406, a negative input, and an output. Delay element 48 has an input connected to the positive input to the summation element 47, and an output connected to the negative input of summation element 47. In this configuration, the comb stage 407 is connected to subtract a time delayed sample value of the input signal from the input signal. Stated another way, the summation element 47 is connected as a subtractor which operates to subtract the delayed input signal (generated by the delay element) from the input signal, thereby generating an output signal that is provided to the next comb stage (or to the CIC output 412). Each of one or more additional comb stages 408-411 may have the same circuit arrangement and operation.

In operation, the function of the DC-removing multi-stage CIC filter 40 is to translate one or more channels of data from an input frequency (e.g., a pass-band intermediate frequency or RF input frequency) to an output frequency (e.g., baseband) and to remove any DC-bias without requiring an external DC-removal filter. With this combined functionality, the disclosed DC-removing multi-stage CIC filter 40 is more efficient than implementing a DC-removal filter separately from the CIC filter. Also, as CIC filter is often in the input, this filter architecture has the advantage of filtering DC bias just at the input. To illustrate the savings in gate count and circuit size, a design synthesis was run on three circuits. In a first design synthesis of a conventional 5-stage CIC filter (N=5, M=1), the equivalent gate count is 6176 gates. In a second design synthesis of a conventional $2^{nd}$ order DC-removal filter (K=2), the equivalent gate count is 5128 gates. Finally, a third design synthesis of a DC-removing CIC filter (N=5, M=1, K=2), the equivalent gate count is 6685 gates. As these design synthesis results show, using the proposed DC-removing CIC filter saves 42% area or 4.7K gates as compared to the conventional approach of combining a convention CIC filter and external DC-removing filter.

As will be appreciated, the structural arrangement of the DC removing filter 40 may be reversed to provide an interpolating CIC filter where the modified integrator 421 and combinator 422 stages have their positions reversed so that the CIC input signal is received by a combinator stage, resampled by an upsampling rate changer, and then processed by the modified integrator stage to generate the CIC output signal. In this example, the combinator stage is connected to receive the CIC input signal, and includes a plurality of series-connected combinator stages which have a circuit structure and connection similar to the comb stages 407-411. At the output of the combinator stage, a rate changer is connected to receive an input from the last comb stage and to generate therefrom an upsampled output signal. At the output of the rate changer, a modified integrator is connected as a plurality of series-connected integrator stages which have a circuit structure and connection similar to the integrator stages, including at least one modified integrator stage (represented by modified integrator stage 401), alone or in combination with one or more additional integrator stages (represented by integrator stage 403). Each modified integrator stage includes a summation element, a delay element, and a multiplier element which are connected as depicted in the figure to effectively incorporate an embedded DC-removal filter which re-uses the delay element that would otherwise be duplicated in an external DC-removal filter, thereby reducing circuit complexity, gate count, and circuit area or size.

Figure 5:
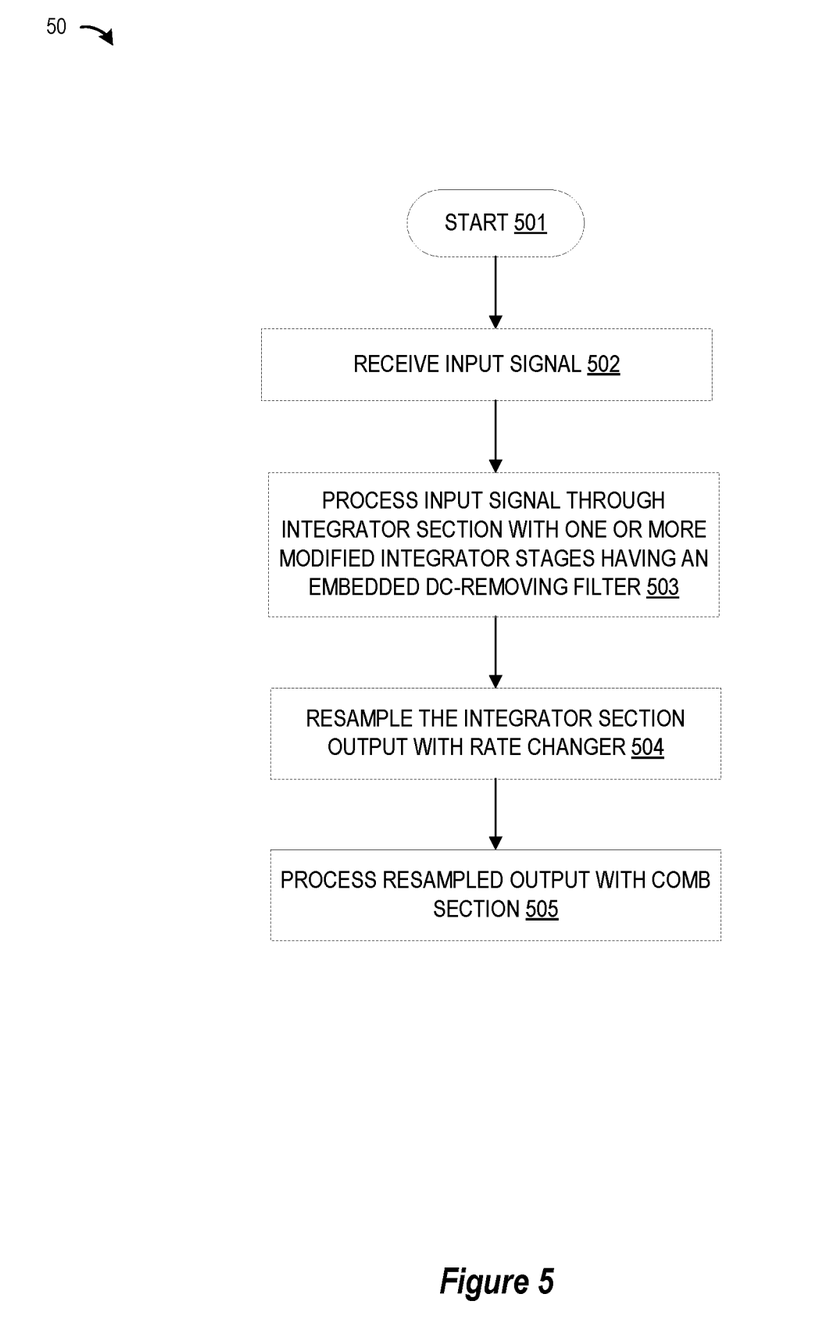
FIG. 5 depicts an operational flow diagram illustration of a method for processing a digital input signal at a DC-removing multi-stage CIC filter in accordance with selected embodiments of the present disclosure.

To provide additional details for an improved understanding of selected embodiments of the present disclosure, reference is now made to FIG. 5 which depicts an operational flow diagram illustration of a method for processing a digital input signal at a DC-removing multi-stage CIC filter. At step 501, the method starts, and an input signal is received at step 502. In selected embodiments, the input signal may be one or more digital input signals received from a digital signal generator, such as an analog-to-digital converter or other digital signal source connected over a communication network or signal line. The input signal may be received by a device having a receiver and/or transmitter in various embodiments.

At step 503, the received input signal is processed at a CIC filter through an integrator section having one or more modified integrator stages which include a summation element, a delay element, and a multiplier element which are connected and configured to effectively incorporate an embedded DC-removal or blocking filter which uses the delay element that would otherwise be duplicated in an external DC-removal filter, thereby reducing circuit complexity, gate count, and circuit area or size. In selected embodiments, the integrator section may include one or more additional integrator stages which include a summation element and a delay element to add a previous output to the modified signal, whereby the previous output is generated by a delay block from a previous (modified) integrator stage. The number of modified integrator stages and additional integrator stages included in the integrator section may vary depending on the order of the desired DC-removal filter and the level of accuracy in spectrum estimation required for a particular application. In selected embodiments, each (modified) integrator stage may implement a different delay coefficient.

At step 504, the output from the integrator section is resampled by an interpolation or decimation factor of R, depending on the application. For example, a downsample rate may be used where the resampling rate R may be hard coded in some embodiments such that the output from the integrator section is always downsampled according to the same sampling rate for all computations. In various embodiments, the resampling rate R may be programmable by a user, such that the user may enter one of plurality of resampling rates into the resampler.

At step 505, the resampled output is processed by a comb section. In selected embodiments, the comb section is formed with one or more comb stages, each of which is configured to subtract a delayed sample from the resampled output. The number of comb stages included within the comb section may be symmetric with the total number of modified and additional integrator stages in the integrator section.

By now it should be appreciated that there is provided herein a DC-removing cascaded integrator-comb (CIC) filter and method for fabricating and operating same. As disclosed, the DC-removing CIC filter includes N integrator stages coupled in series to receive a CIC filter digital input signal and to generate an integrated digital output signal. At least one of the N integrator stages is a first integrator stage having a summation element, a feedback delay element, and a multiplier element, where the summation element has a first input for receiving a first input signal, a second input for receiving a second input signal, and an output coupled through the feedback delay element to the multiplier element which multiplies a DC-removing filter coefficient with an output of the feedback delay element to generate a product output that is provided to the second input of the summation element. In addition, the DC-removing CIC filter includes a rate changer having an input coupled to receive the integrated digital output signal and configured to generate a resampled digital output signal. In selected embodiments, the rate changer is a downsampler coupled to decimate the integrated digital output signal to generate the resampled digital output signal having a lower frequency than the integrated digital output signal from the N integrator stages. The DC-removing CIC filter also includes N comb stages coupled in series to receive the resampled digital output signal and configured to generate a CIC filter digital output signal. In selected embodiments, the N integrator stages also include at least a second integrator stage connected to an output of the first integrator stage, where the second integrator stage includes a second summation element, a second feedback delay element, and a second multiplier element, where the second summation element has a first input for receiving the output of the first integrator stage, a second input for receiving a second input signal, and an output coupled through the second feedback delay element to the second multiplier element which multiplies a second DC-removing filter coefficient with an output of the second feedback delay element to generate a second product output that is provided to the second input of the second summation element. In other embodiments, the N integrator stages include at least a second integrator stage coupled to an output of the first integrator stage, where the second integrator stage includes a second summation element and a second feedback delay element, where the second summation element has first input for receiving a first input signal, a second input for receiving a second input signal, and an output coupled through the second feedback delay element to the second input of the second summation element so that the second summation element produces an output signal that is a time integral of an input signal at the first input. In other embodiments, the N comb stages each include a subtraction element and a second delay element, where the subtraction element has a first positive input for receiving an input signal, a second negative input for receiving a second input signal, and an output, where the input signal is connected through the second delay element to the second input of the second summation element so that the second summation element produces an output signal that is a difference between the input signal and a time delayed version of the input signal. In selected embodiments, the N integrator stages operate at a first sampling frequency of the CID filter digital input signal, and the N comb stages operate at a second sampling frequency of the CIC filter digital output signal. In these embodiments, the first integrator stage in the N integrator stages comprises an embedded DC-removing filter such that the summation element of the first integrator stage is used to provide both an integration function and a DC-removing filter function at the first integrator stage.

In another form, there is provided herein a method for removing DC bias with a cascaded integrator-comb (CIC) filter. In the disclosed methodology, a received CIC filter digital input signal is processed at N integrator stages coupled in series to generate an integrated digital output signal. In order to remove the DC bias by processing the received CIC filter digital, the N integrator stages include at least a first integrator stage having a summation element, a feedback delay element, and a multiplier element, where the summation element has a first input for receiving a first input signal, a second input for receiving a second input signal, and an output coupled through the feedback delay element to the multiplier element which multiplies a DC-removing filter coefficient with an output of the feedback delay element to generate a product output that is provided to the second input of the summation element. In addition, the integrated digital output signal is processed at a rate changer configured to generate a resampled digital output signal, such as by decimating the integrated digital output signal with a downsampler to generate the resampled digital output signal having a lower frequency than the integrated digital output signal from the N integrator stages. In addition, the resampled digital output signal is processed at N comb stages coupled in series to generate a CIC filter digital output signal. In selected embodiments, each of the N comb stages includes a subtraction element and a second delay element, where the subtraction element has a first positive input for receiving an input signal, a second negative input for receiving a second input signal, and an output, where the input signal is connected through the second delay element to the second input of the second summation element so that the second summation element produces an output signal that is a difference between the input signal and a time delayed version of the input signal. In selected embodiments, the processing of the received CIC filter digital input signal at N integrator stages may include processing the output from the first integrator stage at a second integrator stage connected to the output of the first integrator stage, where the second integrator stage includes a second summation element, a second feedback delay element, and a second multiplier element, where the second summation element has a first input for receiving the output of the first integrator stage, a second input for receiving a second input signal, and an output coupled through the second feedback delay element to the second multiplier element which multiplies a second DC-removing filter coefficient with an output of the second feedback delay element to generate a second product output that is provided to the second input of the second summation element. In other selected embodiments, the processing of the received CIC filter digital input signal at N integrator stages may also include processing the output from the first integrator stage at a second integrator stage connected to the output of the first integrator stage, where the second integrator stage includes a second summation element and a second feedback delay element, where the second summation element has first input for receiving a first input signal, a second input for receiving a second input signal, and an output coupled through the second feedback delay element to the second input of the second summation element so that the second summation element produces an output signal that is a time integral of an input signal at the first input. In selected embodiments, the N integrator stages operate at a first sampling frequency of the CID filter digital input signal when processing the received CIC filter digital input signal, and the N comb stages operate at a second sampling frequency of the CIC filter digital output signal when processing the resampled digital output signal. In other embodiments, the first integrator stage in the N integrator stages includes an embedded DC-removing filter. In other embodiments, the summation element of the first integrator stage is used to provide both an integration function and a DC-removing filter function at the first integrator stage.

In yet another form, there is provided herein a cascaded integrator-comb (CIC) decimation filter and associated method for removing DC bias from the CIC filtered signal. In the disclosed CIC decimation filter, N integrator stages coupled in series to receive a first digital input signal having a DC bias and to generate an integrated digital output signal wherein the DC bias is removed, including a first integrator stage which includes a summation element comprising a first input for receiving the digital input signal, a second input for receiving a second input signal, and a summation output; a feedback delay element connected to feedback a delayed version of the summation output; and a multiplier element connected to multiply a DC-removing filter coefficient with the delayed version of the summation output from the feedback delay element to generate a product output that is provided to the second input of the summation element. The CIC decimation filter also includes N differentiator stages coupled in series to receive a second digital input signal and to generate a differential digital output signal. In addition, the CIC decimation filter includes a rate changer coupled between the N integrator stages and N differentiator stages, where the rate changer is connected to receive an input digital signal and is configured to generate a resampled digital output signal. In selected embodiments, the N integrator stages include at least a second integrator stage connected to an output of the first integrator stage, where the second integrator stage includes a second summation element, a second feedback delay element, and a second multiplier element, where the second summation element has a first input for receiving the output of the first integrator stage, a second input for receiving a second input signal, and an output coupled through the second feedback delay element to the second multiplier element which multiplies a second DC-removing filter coefficient with an output of the second feedback delay element to generate a second product output that is provided to the second input of the second summation element. In other embodiments, the first integrator stage in the N integrator stages may include an embedded DC-removing filter. In addition, the summation element of the first integrator stage may be used to provide both an integration function and a DC-removing filter function at the first integrator stage. In selected embodiments, the rate changer is connected as a downsampler between the N integrator stages and the N differentiator stages so that the rate changer is connected to receive the integrated digital output signal from the N integrator stages and to provide the resampled digital output signal as the second digital input signal to the N differentiator stages. In other embodiments, the rate changer is connected as an upsampler between the N differentiator stages and the N integrator stages so that the rate changer is connected to receive the differential digital output signal from the N differential stages and to provide the resampled digital output signal as the first digital input signal to the N integrator stages.

Although the described exemplary embodiments disclosed herein are directed to an DC-removing CIC filter device and associated method of manufacture in which a DC blocking filter is incorporated into one or more integrator stages of a CIC filter, the present invention is not necessarily limited to the example embodiments which illustrate inventive aspects of the present invention that are applicable to a wide variety of CIC filter devices. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Although the described exemplary embodiments disclosed herein focus on a CIC filter which includes one or more modified integrators stages to embed a DC-blocking filter function, the present invention is not necessarily limited to the example embodiments illustrate herein. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A DC-removing cascaded integrator-comb (CIC) filter, comprising:

N integrator stages coupled in series to receive a CIC filter digital input signal and to generate an integrated digital output signal;

a rate changer having an input coupled to receive the integrated digital output signal and configured to generate a resampled digital output signal; and N comb stages coupled in series to receive the resampled digital output signal and configured to generate a CIC filter digital output signal;

wherein the N integrator stages comprise at least a first integrator stage comprising a summation element, a feedback delay element, and a multiplier element, where the summation element has a first input for receiving a first input signal, a second input for receiving a second input signal, and an output coupled through the feedback delay element to the multiplier element which multiplies a DC-removing filter coefficient with an output of the feedback delay element to generate a product output that is provided to the second input of the summation element.

2. The DC-removing CIC filter of claim 1, wherein the N integrator stages comprise at least a second integrator stage connected to an output of the first integrator stage, the second integrator stage comprising a second summation element, a second feedback delay element, and a second multiplier element, where the second summation element has a first input for receiving the output of the first integrator stage, a second input for receiving a second input signal, and an output coupled through the second feedback delay element to the second multiplier element which multiplies a second DC-removing filter coefficient with an output of the second feedback delay element to generate a second product output that is provided to the second input of the second summation element.

3. The DC-removing CIC filter of claim 1, wherein the N integrator stages comprise at least a second integrator stage coupled to an output of the first integrator stage, the second integrator stage comprising a second summation element and a second feedback delay element, where the second summation element has first input for receiving a first input signal, a second input for receiving a second input signal, and an output coupled through the second feedback delay element to the second input of the second summation element so that the second summation element produces an output signal that is a time integral of an input signal at the first input.

4. The DC-removing CIC filter of claim 1, wherein a rate changer comprises a downsampler coupled to decimate the integrated digital output signal to generate the resampled digital output signal having a lower frequency than the integrated digital output signal from the N integrator stages.

5. The DC-removing CIC filter of claim 1, wherein the N comb stages each comprise a subtraction element and a second delay element, where the subtraction element has a first positive input for receiving an input signal, a second negative input for receiving a second input signal, and an output, where the input signal is connected through the second delay element to the second input of the second summation element so that the second summation element produces an output signal that is a difference between the input signal and a time delayed version of the input signal.

6. The DC-removing CIC filter of claim 1, wherein the N integrator stages operate at a first sampling frequency of the CID filter digital input signal and wherein the N comb stages operate at a second sampling frequency of the CIC filter digital output signal.

7. The DC-removing CIC filter of claim 1, wherein the first integrator stage in the N integrator stages comprises an embedded DC-removing filter.

8. The DC-removing CIC filter of claim 1, wherein the summation element of the first integrator stage is used to provide both an integration function and a DC-removing filter function at the first integrator stage.

9. A method for removing DC bias with a digital cascaded integrator-comb (CIC) filter, comprising:
processing a received CIC filter digital input signal at N integrator stages coupled in series to generate an integrated digital output signal;
processing the integrated digital output signal at a rate changer configured to generate a resampled digital output signal; and
processing the resampled digital output signal at N comb stages coupled in series to generate a CIC filter digital output signal;
wherein the N integrator stages comprise at least a first integrator stage comprising a summation element, a feedback delay element, and a multiplier element, where the summation element has a first input for receiving a first input signal, a second input for receiving a second input signal, and an output coupled through the feedback delay element to the multiplier element which multiplies a DC-removing filter coefficient with an output of the feedback delay element to generate a product output that is provided to the second input of the summation element.

10. The method of claim 9, wherein processing the received CIC filter digital input signal at N integrator stages comprises processing the output from the first integrator stage at a second integrator stage connected to the output of the first integrator stage, the second integrator stage comprising a second summation element, a second feedback delay element, and a second multiplier element, where the second summation element has a first input for receiving the output of the first integrator stage, a second input for receiving a second input signal, and an output coupled through the second feedback delay element to the second multiplier element which multiplies a second DC-removing filter coefficient with an output of the second feedback delay element to generate a second product output that is provided to the second input of the second summation element.

11. The method of claim 9, wherein processing the received CIC filter digital input signal at N integrator stages comprises processing the output from the first integrator stage at a second integrator stage connected to the output of the first integrator stage, the second integrator stage comprising a second summation element and a second feedback delay element, where the second summation element has first input for receiving a first input signal, a second input for receiving a second input signal, and an output coupled through the second feedback delay element to the second input of the second summation element so that the second summation element produces an output signal that is a time integral of an input signal at the first input.

12. The method of claim 9, wherein processing the integrated digital output signal at the rate changer comprises decimating the integrated digital output signal with a downsampler to generate the resampled digital output signal having a lower frequency than the integrated digital output signal from the N integrator stages.

13. The method of claim 9, wherein processing the resampled digital output signal at N comb stages comprises processing the resampled digital output signal with N comb stages, each comprising a subtraction element and a second delay element, where the subtraction element has a first positive input for receiving an input signal, a second negative input for receiving a second input signal, and an output, where the input signal is connected through the second delay element to the second input of the second summation element so that the second summation element produces an output signal that is a difference between the input signal and a time delayed version of the input signal.

14. The method of claim 9, wherein the N integrator stages operate at a first sampling frequency of the CID filter digital input signal when processing the received CIC filter digital input signal, and wherein the N comb stages operate at a second sampling frequency of the CIC filter digital output signal when processing the resampled digital output signal.

15. The method of claim 9, wherein the first integrator stage in the N integrator stages comprises an embedded DC-removing filter.

16. The method of claim 15, wherein the summation element of the first integrator stage is used to provide both an integration function and a DC-removing filter function at the first integrator stage.

17. A cascaded integrator-comb (CIC) decimation filter, comprising:

N integrator stages coupled in series to receive a first digital input signal having a DC bias and to generate an integrated digital output signal wherein the DC bias is removed;

N differentiator stages coupled in series to receive a second digital input signal and to generate a differential digital output signal; and a rate changer coupled between the N integrator stages and N differentiator stages, where the rate changer is connected to receive an input digital signal and is configured to generate a resampled digital output signal;

wherein the N integrator stages coupled in series include a first integrator stage in the series comprising:

a summation element comprising a first input for receiving the first digital input signal, a second input for receiving a second input signal, and a summation output, a feedback delay element connected to feedback a delayed version of the summation output, and a multiplier element connected to multiply a DC-removing filter coefficient with the delayed version of the summation output from the feedback delay element to generate a product output that is provided to the second input of the summation element.

18. The CIC decimation filter of claim 17, wherein the N integrator stages comprise at least a second integrator stage connected to an output of the first integrator stage, the second integrator stage comprising a second summation element, a second feedback delay element, and a second multiplier element, where the second summation element has a first input for receiving the output of the first integrator stage, a second input for receiving a second input signal, and an output coupled through the second feedback delay element to the second multiplier element which multiplies a second DC-removing filter coefficient with an output of the second feedback delay element to generate a second product output that is provided to the second input of the second summation element.

19. The CIC decimation filter of claim 17, wherein the rate changer is connected as a downsampler between the N integrator stages and the N differentiator stages so that the rate changer is connected to receive the integrated digital output signal from the N integrator stages and to provide the resampled digital output signal as the second digital input signal to the N differentiator stages.

20. The CIC decimation filter of claim 17, wherein the rate changer is connected as an upsampler between the N differentiator stages and the N integrator stages so that the rate changer is connected to receive the differential digital output signal from the N differential stages and to provide the resampled digital output signal as the first digital input signal to the N integrator stages.

* * * * *